United States Patent
Meister et al.

(10) Patent No.: US 11,863,917 B2
(45) Date of Patent: Jan. 2, 2024

(54) ASSEMBLY OF NETWORK SWITCH ASIC WITH OPTICAL TRANSCEIVERS

(71) Applicant: SICOYA GMBH, Berlin (DE)

(72) Inventors: Stefan Meister, Berlin (DE); Hanjo Rhee, Berlin (DE); Moritz Grehn, Berlin (DE); Sven Otte, Hohen Neuendorf (DE); Andrea Zanzi, Berlin (DE); Mischa Gehring, Hohen Neuendorf (DE)

(73) Assignee: SICOYA GMBH, Berlin (DE)

( * ) Notice: Subject to any disclaimer, the term of this patent is extended or adjusted under 35 U.S.C. 154(b) by 0 days.

(21) Appl. No.: 17/286,446

(22) PCT Filed: Oct. 21, 2019

(86) PCT No.: PCT/EP2019/078591
§ 371 (c)(1),
(2) Date: Apr. 16, 2021

(87) PCT Pub. No.: WO2020/083845
PCT Pub. Date: Apr. 30, 2020

(65) Prior Publication Data
US 2021/0392419 A1 Dec. 16, 2021

(30) Foreign Application Priority Data
Oct. 23, 2018 (DE) .................... 10 2018 218 074.1

(51) Int. Cl.
*H04Q 11/00* (2006.01)
*G02B 6/42* (2006.01)

(52) U.S. Cl.
CPC ......... *H04Q 11/0005* (2013.01); *G02B 6/423* (2013.01); *G02B 6/4246* (2013.01); *H04Q 2011/0016* (2013.01); *H04Q 2213/1301* (2013.01)

(58) Field of Classification Search
CPC ....... H04Q 11/0005; H04Q 2011/0016; H04Q 2213/1301; G02B 6/423; G02B 6/4246; G02B 6/12; H04B 10/40; H04B 10/501
See application file for complete search history.

(56) References Cited

U.S. PATENT DOCUMENTS

| 7,817,880 | B1 | 10/2010 | Drost et al. | |
|---|---|---|---|---|
| 2011/0243507 | A1* | 10/2011 | Kim | G02B 6/30 385/78 |
| 2013/0188970 | A1* | 7/2013 | Shastri | G02B 6/4214 398/201 |
| 2013/0308898 | A1* | 11/2013 | Doerr | G02B 6/428 385/14 |

(Continued)

FOREIGN PATENT DOCUMENTS

WO 2017/132481 A1 8/2017

OTHER PUBLICATIONS

Search Report and Written Opinion dated Feb. 14, 2020 issued in related International Patent Application No. PCT/EP2019/078591; filed Oct. 21, 2019.

*Primary Examiner* — Pranesh K Barua
(74) *Attorney, Agent, or Firm* — Gordon Rees Scully Mansukhani, LLP

(57) ABSTRACT

The invention relates to a switch system comprising one or more optical transceiver assemblies (14) connected to a switch ASIC (29).

26 Claims, 16 Drawing Sheets

(56) References Cited

U.S. PATENT DOCUMENTS

Figure 1:
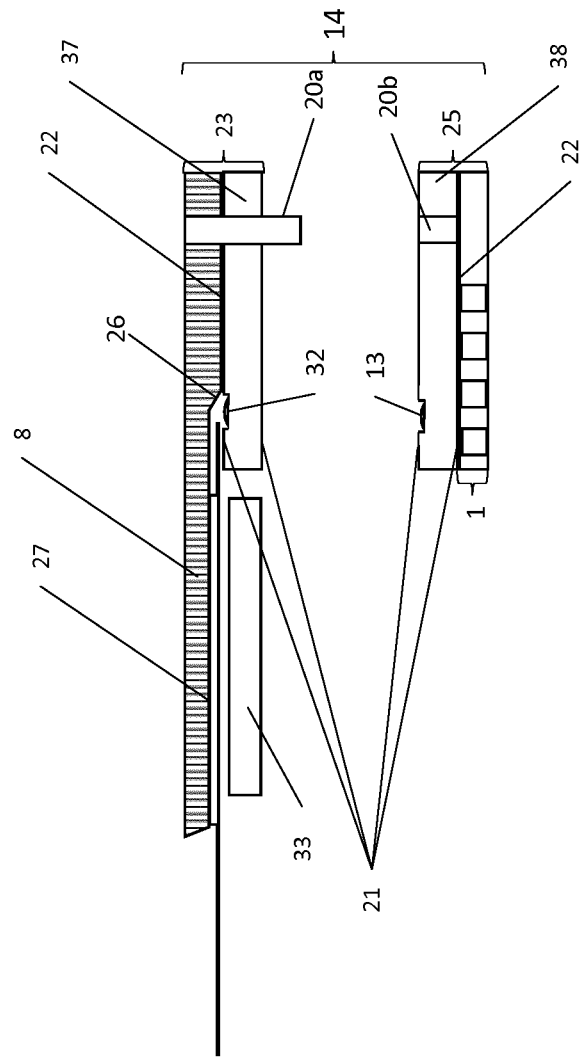

| | | | |
|---|---|---|---|
| 2013/0315586 A1* | 11/2013 | Kipp | H04Q 11/0005 |
| | | | 398/45 |
| 2014/0064659 A1* | 3/2014 | Doerr | G02B 6/43 |
| | | | 385/14 |
| 2015/0117821 A1* | 4/2015 | Aoki | G02B 6/3855 |
| | | | 385/83 |
| 2015/0180578 A1* | 6/2015 | Leigh | G02B 6/4292 |
| | | | 398/135 |
| 2015/0311137 A1* | 10/2015 | Oganesian | H01L 23/3677 |
| | | | 257/712 |
| 2016/0161687 A1* | 6/2016 | Rosenberg | G02B 6/30 |
| | | | 385/14 |
| 2016/0334575 A1* | 11/2016 | Graves | G02B 6/126 |
| 2018/0003891 A1* | 1/2018 | Wada | B29C 45/73 |
| 2018/0017744 A1* | 1/2018 | DeMeritt | G02B 6/4259 |
| 2019/0033542 A1* | 1/2019 | Epitaux | G02B 6/4226 |
| 2019/0036618 A1* | 1/2019 | Hasharoni | H04B 10/25891 |
| 2019/0086618 A1* | 3/2019 | Shastri | H01S 5/02469 |

* cited by examiner

ASSEMBLY OF NETWORK SWITCH ASIC WITH OPTICAL TRANSCEIVERS

Exemplary embodiments of the invention are related to high bandwidth switch ASICs in network servers. A switch ASIC and an optical transceiver assembly are placed on the one high-speed substrate so that the electrical connections are very short for minimum signal distortion. TSVs in the transceiver chip separate the optical interfaces from the electrical interfaces in order to avoid wire bonding and provide an efficient heat dissipation concept. The TSVs and pluggable optical connector allow for a reflow solderable assembly of the transceiver receptacle. Due to the compactness of the transceiver receptacle and the pluggable optical connector the fibers extend horizontally from the transceiver assembly which allows for placing a heat spreader on top of the transceiver assembly. The pluggable optical connector encompasses a stack of silicon pieces so that the heat can be very efficiently dissipated away from the transceiver chip. The lasers can be connected to the transceiver chips externally from an external source outside the high-speed substrate. The switch ASIC can be connected to the same heat spreader.

DEFINITION OF TERMS

Network switch, this being the term used by those skilled in the art, to describe a computer networking device that connects devices together on a computer network by using packet switching to receive, process, and forward data to the destination device.

Switch ASIC (application-specific integrated circuit), this being the term used by those skilled in the art, to describe a semiconductor chip, typically deployed within a network switch that connects devices together on a computer network by using packet switching to receive, process, and forward data to the destination device.

High-speed substrate, this being the term used by those skilled in the art, to describe a signal carrying material and design where the integrity of the signals is not heavily affected by the physical characteristics of the circuit board, like the layout, packaging, layer stack-up, interconnections, etc.

Switch co-package, this being the term used by those skilled in the art, to describe an assembly where the switch ASIC and additional semiconductor chips are placed on a common high-speed substrate in order to achieve chip-to-chip communication with high signal integrity and low power consumption.

Optical transceiver assembly, this being the term used to describe a system for connecting one or an array of optical signal paths, like fibers, with the optical coupling element in a photonic integrated circuit.

EPIC: Electronic-Photonic-Integrated-Circuit (EPIC)

Optical transceivers, this being the term used by those skilled in the art, serve as transmitters and receivers for converting electrical data signals into optical signals, and vice versa.

TSV with metal pads, this being the term used by those skilled in the art, to describe through silicon via, a connection line to a conductor track connection or metal pad situated below the transceiver chip substrate bottom side, wherein the connection line extends through a through hole in the substrate from the electronic or electro-optical component to the conductor track connection or metal pad situated below the substrate rear side.

Optical wavelength multiplexer, this being the term used by those skilled in the art, to describe a device which multiplexes a number of optical carrier signals onto a single optical signal path like a fiber or a waveguide by using different wavelengths.

Optical wavelength demultiplexer, this being the term used by those skilled in the art, to describe a device which demultiplexes an optical input signal from a single optical signal path like a fiber or a waveguide containing a number of optical carrier signals using different wavelengths into multiple optical signal paths each containing one optical carrier signal.

Wavelength-division multiplexing (WDM), this being the term used by those skilled in the art, to describe a technology which multiplexes a number of optical carrier signals onto a common signal path like a fiber or a waveguide by using different wavelengths.

Time-division multiplexing (TDM), this being the term used by those skilled in the art, to describe a method of transmitting and receiving independent signals over a common signal path so that each signal appears on the line only a fraction of time in an alternating pattern.

Polarization-division multiplexing (PDM), this being the term used by those skilled in the art, to describe a method for multiplexing signals carried on electromagnetic waves, allowing two channels of information to be transmitted on the same carrier frequency by using waves of two orthogonal polarization states.

Fiber array, this being the term used by those skilled in the art, to describe an array of optical fibers grouped into a parallel bundle or ribbon by using an encasing cable coating.

Multicore fiber, this being the term used by those skilled in the art, to describe an optical fiber containing more than one fiber core.

Thermo interface material, this being the term used by those skilled in the art, to describe a material which is used in the interface of assembled components in order to achieve a good heat conductivity.

Ball grid array, this being the term used by those skilled in the art, to describe a type of surface-mount packaging used for integrated circuits. A regular array of solder balls creates a solderable connection on the bottom side of a PCB.

Transfer mold, this being the term used by those skilled in the art, to describe a manufacturing process where casting material is forced into a mold in order to achieve an encapsulation of the components in the co-package.

Lens array chip, this being the term used by those skilled in the art, to describe an array of lenses etched in a silicon substrate.

Through-hole, this being the term used by those skilled in the art, to describe an etched hole through the substrate.

Main Board, this being the term used by those skilled in the art, to describe a larger printed circuit board, which holds and allows communication between many of the crucial electronic components of a system and provides connectors for other peripherals.

Pluggable optical connector, this being the term used to describe an optical interface assembly, comprising a fiber mount to fix the fibers, a mirror facet on the side where the fiber is terminated.

Optical transceiver chip, Electronic-Photonic-Integrated-Circuit (EPIC) which comprises transceiver functionality for conversion of electrical into optical signals and vice versa.

An exemplary embodiment of the invention relates to a switch package configuration comprising one or more (e.g. all) of the following features:

16 optical transceiver assemblies are connected to one 51.2 Tbit/s switch ASIC, 4 optical transceiver assemblies on each side of the switch ASIC (see picture). In this case:

32 transmitter and 32 receiver input and output channels between one optical transceiver assemblies and the switch ASIC with 100 Gbit/s net data rate per channel. Aggregated data throughput of one optical transceiver assembly is 3.2 Tbit/s.

The following variants A-C of the above embodiment are considered advantageous:

A) in a parallel arrangement (all channels coupled in different fibers: The 16 optical transceiver assemblies containing 16 pluggable fiber connectors (one each). Each pluggable optical connectors contains preferable 72 fibers (32× receiver fibers, 32× transmitter fibers, and 8 fibers for external laser input to the EPIC). Aggregated fiber count of the switch Package is 1152 fibers. This arrangement supports standards, like IEEE 400GBASE-DR4 (one fiber per channel)

B) Arrangement with optical multiplexer (e.g. 4:1) and optical demultiplexer (e.g. 1:4), e.g. integrated in the pluggable optical connectors (figure). Each pluggable optical connector contains preferable 24 fibers (8× receiver fibers, 8× transmitter fibers, and 8 fibers for external laser input to the EPIC). Aggregated fiber count of the switch package is 384 fibers. This arrangement supports standards, like IEEE 400GBASE-FR4.

Arrangement A) and B) can be arranged in a form that they can be used with the same transceiver receptacle of the transceiver assembly. In this case, the pluggable optical connector needs to be exchanged.→advantageous for a configurable switch package and/or switch system, which can be changed between both arrangements by only exchanging the optical connector, the fiber cable assembly and the external laser source.

C) Arrangement with multicore fibers attached to the pluggable optical connectors. The pluggable optical connectors couples the N beams of the multicore fiber with a beamforming arrangement (mirrors, lenses, . . . ) into the transceiver chip. With such a multicore fiber arrangement the number of fibers per pluggable optical connector as well as the aggregated fiber count of the switch package is reduced, e.g. by a factor of 1/N. The N beams from at least one multicore fiber are deflected by a mirror facet in the pluggable optical connector and directed towards lens arrays or arrays of lens arrays in lens array chip 1 and lens array chip 2. The single lenses as part of one lens array are arranged to match the pattern of the multiple cores inside the multicore fibers. After passing through lens array chip 2 the light from each core is directed to separate grating couplers in the EPIC chip.

A further exemplary embodiment of the invention relates to a switch System with optical input and output interfaces and electrical switch functionalities and may comprise one or more of the following features:

One (or more) switch ASIC(s) with one (or more) array(s) of optical transceivers assemblies.

Co-packaged on a high-speed substrate with a ball grid array or land grid array on the bottom.

RF high-speed lines between the switch ASIC and the transceiver assembly are routed within the high-speed substrate.

DC and controls are connected via a ball grid array or land grid array interface to the main board.

Switch ASIC are soldered in flip chip configuration on the top side of the high-speed substrate.

Electrical interfaces on the transceiver chip are routed by through silicon vias (TSV) to metal pads on the bottom side of the transceiver chip.

The lens array chip 2 is placed on the top side of the transceiver chip.

The fiber array is mounted inside the pluggable optical connector and are extending horizontally away from the transceiver assembly The pluggable optical connector.

Transceiver assembly is reflow-solderable to contact the electrical interfaces when the pluggable optical connector is plugged off.

The pluggable optical connector and the transceiver receptacle mainly consist of silicon. Preferred materials for the pieces of the stack are bulk silicon, silicon-on-Insulator (SOI) or SiO2 glass.

One or more heat spreaders are mounted on the transceiver assembly to hold the pluggable optical connector into position and to dissipate the heat.

Laser radiation is supplied into the transceiver assembly by additional fibers in the pluggable optical connector.

The input interface for external laser radiation into the transceiver chip is polarization independent.

Optical coupling element is a grating coupler in the transceiver chip which accepts the laser light in an angle 3°-25° in respect to the surface plane of the transceiver chip.

Optical coupling elements in the transceiver chip are grating couplers.

De-/multiplexing functionality is integrated in the pluggable optical connector. This can be achieved by arrayed waveguide gratings realized in planar light-guiding circuits using silicon, SOI, or glass.

Guide pins are used to align the pluggable optical connector to the transceiver receptacle in the horizontal plane and used to give mechanical stability.

De-/multiplexing functionality of the pluggable optical connector can also be integrated in the fiber assembly (separate from the stack of the pluggable optical connector).

High-speed electrical connections are differential lines.

Wavelength division multiplexing (WDM), time division multiplexing (TDM) and polarization division multiplexing (PDM) can be used for multiplexing. WDM, TDM and PDM are not mutually exclusive.

One or several switch ASICs (silicon chip) with high aggregated data throughput (data rate), e.g. 51.2 Tbit/s.

The switch ASIC is an electrical switch with electrical input and output interfaces.

e.g. 512 transmitter output and 512 receiver output channels are provided by the switch co-package.

The net data rate per channel is 100 Gbit/s e.g. using PAM-4 modulation format.

One or more heat spreaders are part of the switch co-package and dissipate the heat from the switch co-package.

Multicore fibers are used to combine multiple transmission channels in one fiber.

Different modulation formats can be implemented in the transceiver assembly, such as NRZ, PAM-N, especially PAM-4, QPSK or DP-QPSK.

A number of electrical input signals are combined into one optical fiber by means of Nyquist pulses. The modulation sidebands of one Nyquist channel are temporally arranged in such a way that the center of each transmitted symbol is located at the crossing points of the other Nyquist channels. On the receiver side a local oscillator in combination with a balanced receiver system is used to retrieve each Nyquist channel.

Further exemplary embodiments of the invention relate to:

1) An arrangement comprising one or more transceiver assemblies which convert electrical high-speed data signals from one or more switch ASICs into optical high-speed data signals and couple these optical signals into optical waveguides (e.g. optical fibers) and vice versa. The transceiver assembly may comprise a layer system. The layer system may include one or more of the following features:

- The optical transceiver chip is preferably realized as an electronic photonic integrated circuit (EPIC) including TSVs with pads on the bottom side of the EPIC chip as electrical interfaces and grating couplers as optical interfaces to the other layers of the transceiver assembly on the top side of the EPIC chip.
- Optical beam forming layers. These layers may contain lenses or lens arrays etched into the layer material,
- Pluggable interface incl. mechanical guide pins inside the layer assembly,
- Optical imaging designed so that the beam is expanded and collimated in order to achieve relaxed alignment tolerances between the pluggable optical connector and the transceiver receptacle,
- Fiber interfaces layer in the pluggable optical connector: V-grooves are used to align and fix the fibers; an anisotropically etched mirror facet reflects the beam towards the transceiver chip.

The arrangement and/or the layer systems preferably comprise one or more of the following features:

- All layers of the transceiver assembly are preferably based on silicon substrates as the base material. This leads to identical thermal expansion coefficients and high heat conductivity. Both are advantageous because of high power dissipation in the EPIC and high temperatures in the switch co-package,
- The transceiver assembly is preferably soldered onto the high-speed substrate,
- A pluggable optical connector is advantageous to make the lower part of the transceiver assembly, i.e. the transceiver receptacle solderable (The fibers in the pluggable optical connector do not withstand soldering temperatures),
- E.g. 32 transmitter and 32 receiver input and output channels per transceiver assembly,
- The transceiver assembly has preferably external laser inputs via fiber interfaces
  - External laser input is preferably polarization independent by a special arrangement in the EPIC transceiver chip.

and/or

2) A fiber cable assembly containing a bundle of fibers which optically connects the pluggable optical connector of the transceiver assembly to the outside world, e.g. by a connector in the housing of the Network switch System.

In a parallel arrangement, the fiber cable assembly preferably contains 72 fibers. On the side that is connected to the pluggable optical connector, all fibers are arranged in one row. The fibers of the cable have, e.g. a diameter of 80 μm and are fixed in the pluggable optical connector with a pitch of e.g. 82 μm. On the side that is connected to the fiber cable, the fiber bundle in the cable is arranged in e.g. 4 lines with 18 columns. This is helpful to provide reasonable bending radii in two axes. On the side that is connected to the front plate of the Network switch System, the four lines of the cable are split into four fan-out cables terminated by e.g. 4 connectors in the housing of the Network switch System. Each of the four fan-out cables transport 800 Gbit/s optical data streams and additionally the light of one or several external lasers (in 2 of the 18 fibers) to the connector in the housing of the Network switch System.

A further exemplary embodiment of the invention relates to a switch System where 16 transceiver tiles are arranged on the four sides of the ASIC chip, four on each side to process the incoming and outgoing data traffic. The optical transceivers with optical input and output interfaces and electrical input and output interfaces and may comprise one or more of the following features:

- One (or more) switch ASIC(s) with one (or more) array(s) of optical transceivers assemblies.
- The optical transceiver assembly is located on a primary high-speed substrate which is mechanically and electrically connected to the high-speed substrate which carries the ASIC chip.
- The optical transceiver chip is located next to a digital signal processing chip on the same primary high-speed substrate
- The primary high-speed substrate is connected via ball grid array or land grid array interface to the high-speed substrate which carries the ASIC.
- The primary high-speed substrate comprising the optical transceiver package ("Tile") has a width of 7-10 mm and a length of 20-40 mm
- The transceiver chip holds one or more (e.g. all) of the following functionalities:
  - Modulator driver and modulator,
  - photodetector and trans-impedance amplifier,
  - optical monitor and control functionalities,
  - SPI or I$^2$C communication to the DSP chip, to the external laser source, to the host board and/or to a central communication unit.
- The transceiver chip covers one or more (e.g. all) of the typical monitoring and diagnostics functionalities which are:
  - Loopbacks online- and network side.
  - Connection to the DSP according to IEEE-Standard 1149.1.
  - Detect and signal LOS event at the receiver optical input.
  - Monitor of the average power and frequency response of the optical signal and the modulator output.
  - Check locking status of the DSP on transmitter and receiver.
  - Internal voltage monitor.
  - Internal temperature sensors.
  - Generation of interrupt signals.
- The pluggable optical connector is realized by two separate structure of alignment features, one for coarse alignment and one for fine alignment.
- The fine alignment feature is implemented in the silicon layer stack. The coarse alignment feature is realized by structures in the enclosure of the transceiver chip and the package around the optical connector.

Two fine alignment features of the pluggable optical connector comprise self-aligning features. Such a self-aligning feature may be a pocket in the surface of the chip holding a ball, such that half of the ball is recesses.

A fiber ribbon or fiber array is permanently attached to the transceiver package ("pigtail").

The fiber array or fiber ribbon extents horizontally from the transceiver package The fiber array or fiber ribbon has a pitch between 80 μm and 255 μm.

Wavelength division multiplexing is realized from discrete optical elements like thin film filter to selectively pass the wavelengths into different channels.

Wavelength division multiplexing is realized from planary lightguide circuits (PLC) to selectively pass the wavelengths into different channels.

Wavelength division multiplexing is realized in the optical fiber connection from the transceiver chip to the front plate of the device.

The fiber array terminates at the front plate of the switch device.

The fiber array consists of two distinct fiber ribbons, one for the input and output traffic and one for an external laser sourcing the transceiver chip with laser light.

The fiber connection between the external laser source and the transceiver chip is realized from polarization maintaining (PM) fibers.

The transceiver package has two distinct fiber connections, one is connected to the signal stream, the other is connected to the external laser source.

The functional building blocks of the transmitter and the functional building blocks of the receiver are compiled to form rectangular subunits. The subunits are then linearly or two dimensionally patterned over the transceiver chip. This allows for a very modular design of the chip.

Preferably an equal and even numbered amount of optical transceiver assemblies is arranged on each side in the plane of the switch ASIC and each group of optical transceiver assemblies on each side is electrically and mechanically connected to a common second high-speed substrate. The electrical and mechanical connection of each of the second high-speed substrates to the high-speed substrate is realized by a flexible high-speed substrate. This arrangement reduces the overall size of the high-speed substrate and therefore helps to relax mechanical stress on the respective substrates due to bonding to a host board or placement of heat spreaders and related thermal expansion. Furthermore, the high-speed substrate, carrying the switch ASIC, and the respective second high-speed substrates, carrying the transceiver assemblies, are more effectively thermally decoupled from each other, thus reducing the temperature of the transceiver assemblies. The flexible high-speed substrate is preferably realized as a flexible flat cable.

When a digital signal processing chip (DSP) is located next to the transceiver chip on the same primary high-speed substrate, the distance of the DSP to the switch ASIC is preferably smaller than the distance of the transceiver chip to the switch ASIC in order to reduce the thermal impact of the switch ASIC on the transceiver chip and this achieve a lower temperature in the transceiver chip. Another advantage is the shorter length of the electrical connections between the switch ASIC and the DSP in order to improve the signal integrity.

Each of the features mentioned above in context with any exemplary embodiment or variant can be combined with any other feature of the same exemplary embodiment or variant. Furthermore, each of the features mentioned above in context with any exemplary embodiment or variant can be combined with any other feature of the any other exemplary embodiment or any other variant.

In order that the manner in which the above-recited and other advantages of the invention are obtained will be readily understood, specific embodiments of the invention are illustrated in the appended FIGS. 1-16. The drawings depict only typical embodiments of the invention in an exemplary fashion and are therefore not to be considered to be limiting of its scope.

In FIGS. 1-16, the reference numerals refer to the following elements:

1: Optical transceiver chip (2 layers)
2: Primary high-speed substrate
3: Digital signal processing chip
4: Coarse alignment feature (Feed hole)
5: Coarse alignment feature (guide pin)
6: Fine alignment feature (Feed hole)
7: Fine alignment feature (guide pin)
8: Fiber mount
9: Heat spreader
10: Fiber ribbon
11: Ball grid array (between optical transceiver chip and primary high-speed substrate)
12: Ball grid array (on the bottom of the high-speed substrate)
13: Lenses on the optical transceiver chip
14: Transceiver assembly
15: Wavelength multiplexer
16: Second fiber ribbon
17: Connector for the input and output signals (to connect at the front plate)
18: Polarization maintaining fiber ribbon (for the laser radiation)
19: Connector for the input of the external laser source
20*a* Guide pin
20*b*: Through hole
21: Anti-reflective coating
22: Thermo interface material
23: Pluggable optical connector
24: Switch main board
25: Transceiver receptacle
26: Mirror facet
27: UV curing glue
28: Layer stack with Transceiver chip
29: Switch ASIC (application-specific integrated circuit)
30: Second high-speed substrate
31: Glob Top transfer mold
32: Lenses in the optical connector
33: Lid for fiber mount
34: High-speed substrate
35: Front plate
36: Flexible high-speed substrate
37: Lens array chip 1
38: Lens array chip 2
39: Transceiver assembly transfer mold In an exemplary embodiment of the invention, a transceiver chip 1 is mounted on a primary high-speed substrate 2 via a ball grid array 11 (e.g. see FIGS. 12 and 13). Next to the transceiver chip 1, a digital signal processing chip 3 is mounted the same primary high-speed substrate 2. The primary high-speed substrate 2 is connected to the high-speed substrate 34 (see FIG. 10) via a second ball grid array 12. The high-speed substrate 34 (see FIG. 10) also carries the switch ASIC 29.

Figure 12:
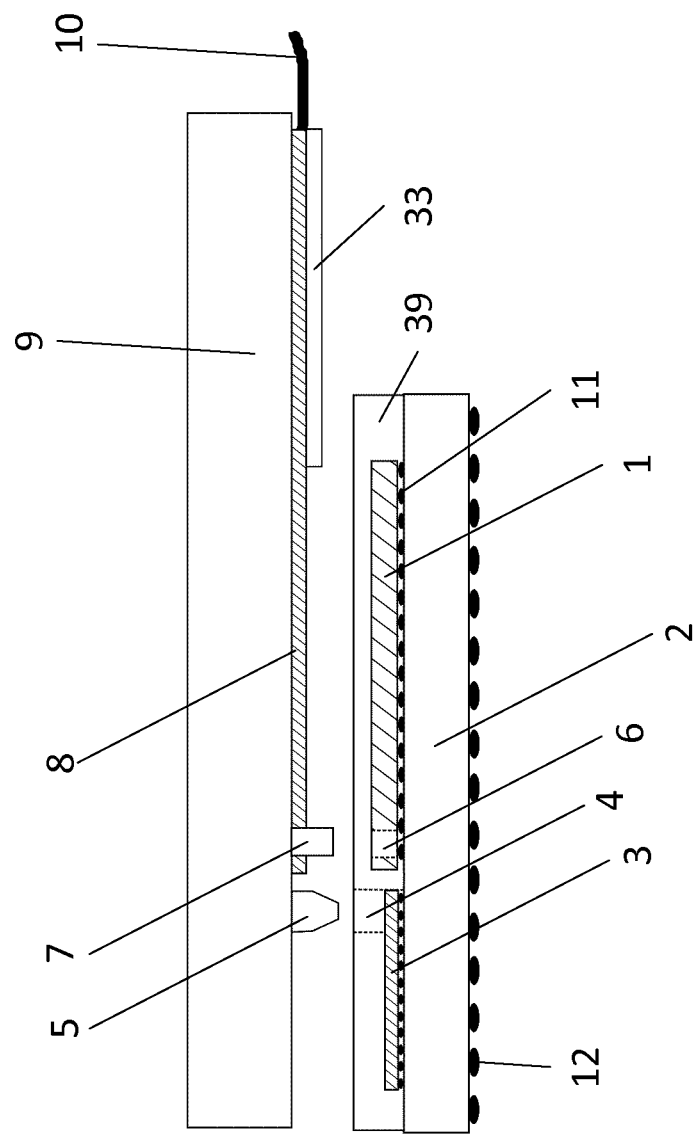

The upper parts in FIG. 12 form an optical connector that comprises a fiber mount 8 which holds a fiber ribbon 10, coarse alignment features, here shown as guide pins 5, and fine alignment features, here shown as guide pins 7. Their counterparts are feed holes 4 providing coarse alignment features in the enclosure of the transceiver chip 1 and the digital signal processing chip 3, and feed holes 6 providing fine alignment features in the layer stack of the transceiver chip 1.

The bottom parts in FIG. 12—namely the transceiver chip 1, the digital signal processing chip 3, the enclosure of the transceiver chip 1 and the digital signal processing chip 3, and the primary high-speed substrate 2—form a receptacle that is configured to receive the coarse alignment features (guide pins 5) and the fine alignment features (guide pins 7) of the upper optical connector.

Figure 13:
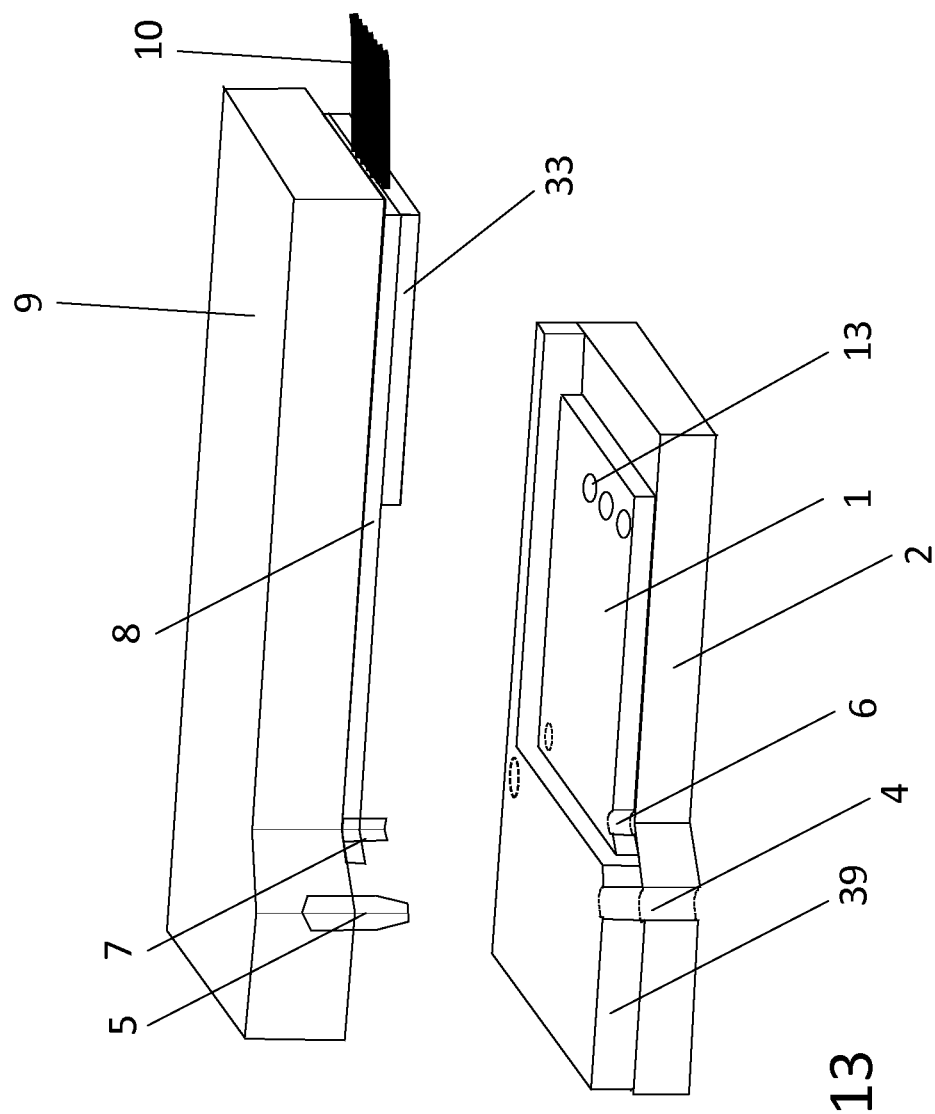
Figure 14:
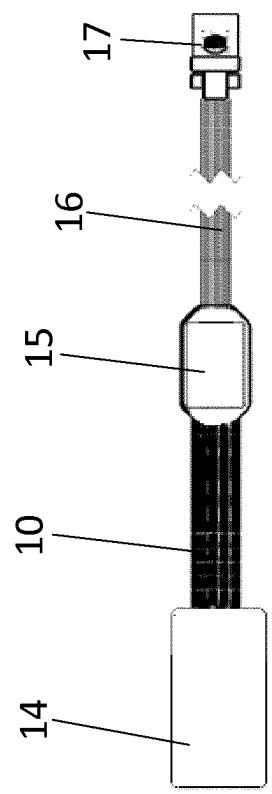
Figure 15:
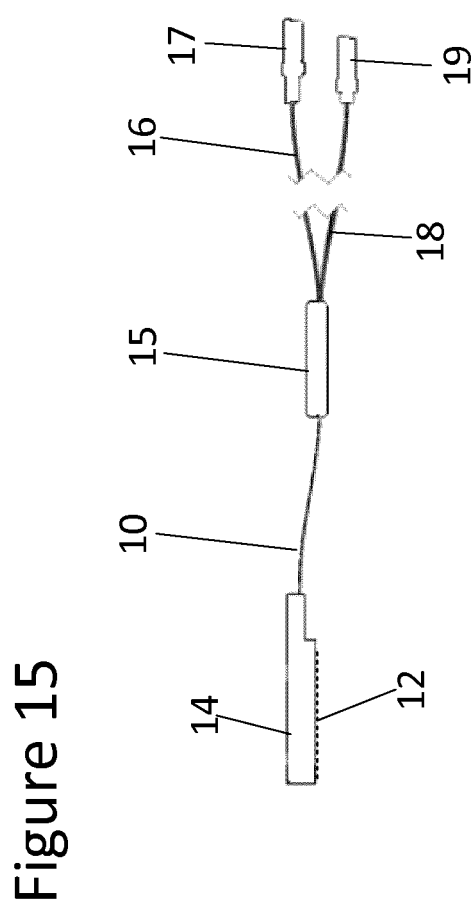
Figure 16:
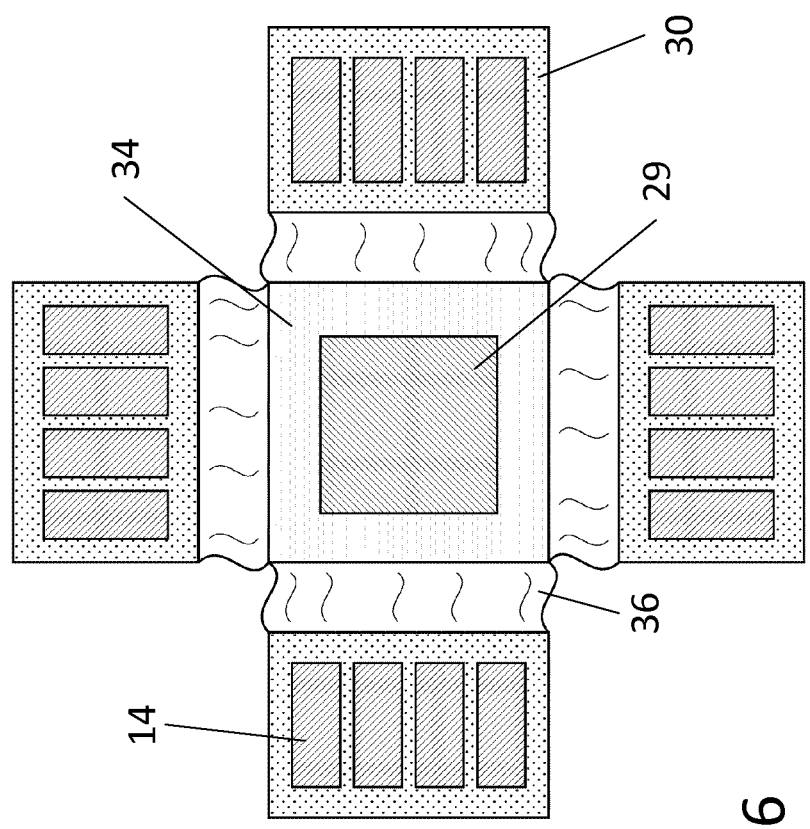

The feed holes 4 may extend into the primary high-speed substrate 2 as shown in FIG. 13.

FIG. 13 also depicts lenses 13 for beam shaping that are located on the top surface of the transceiver chip 1.

Figure 2:
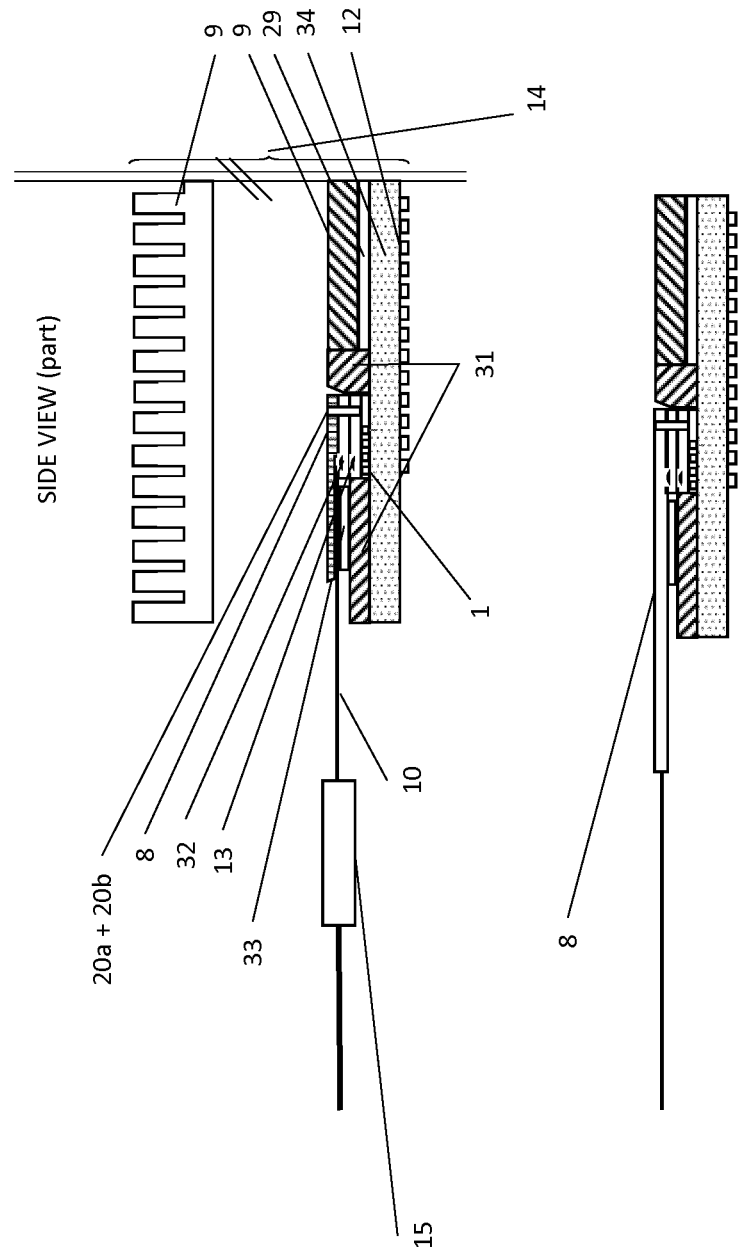
Figure 3:
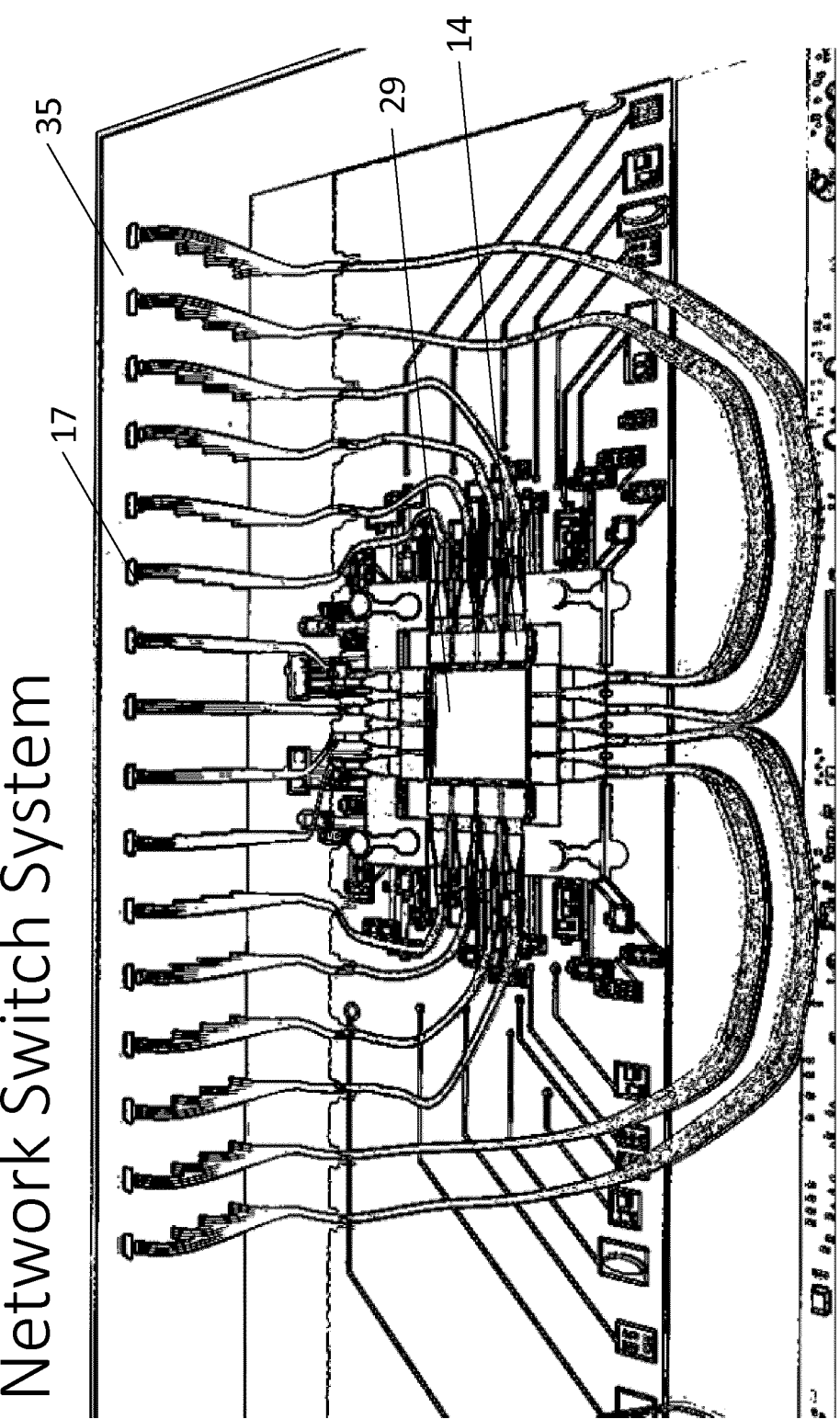
Figure 4:
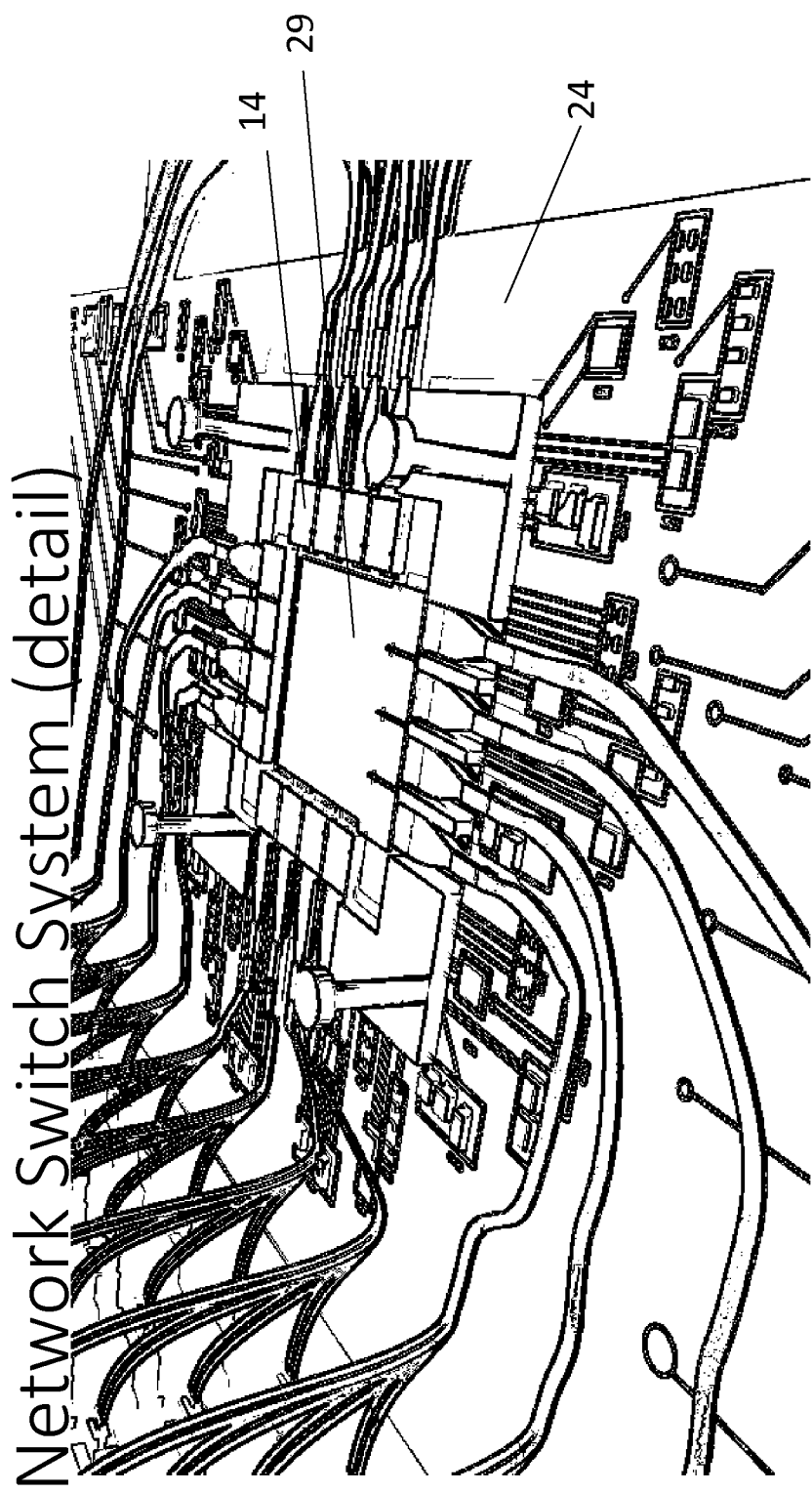
Figure 5:
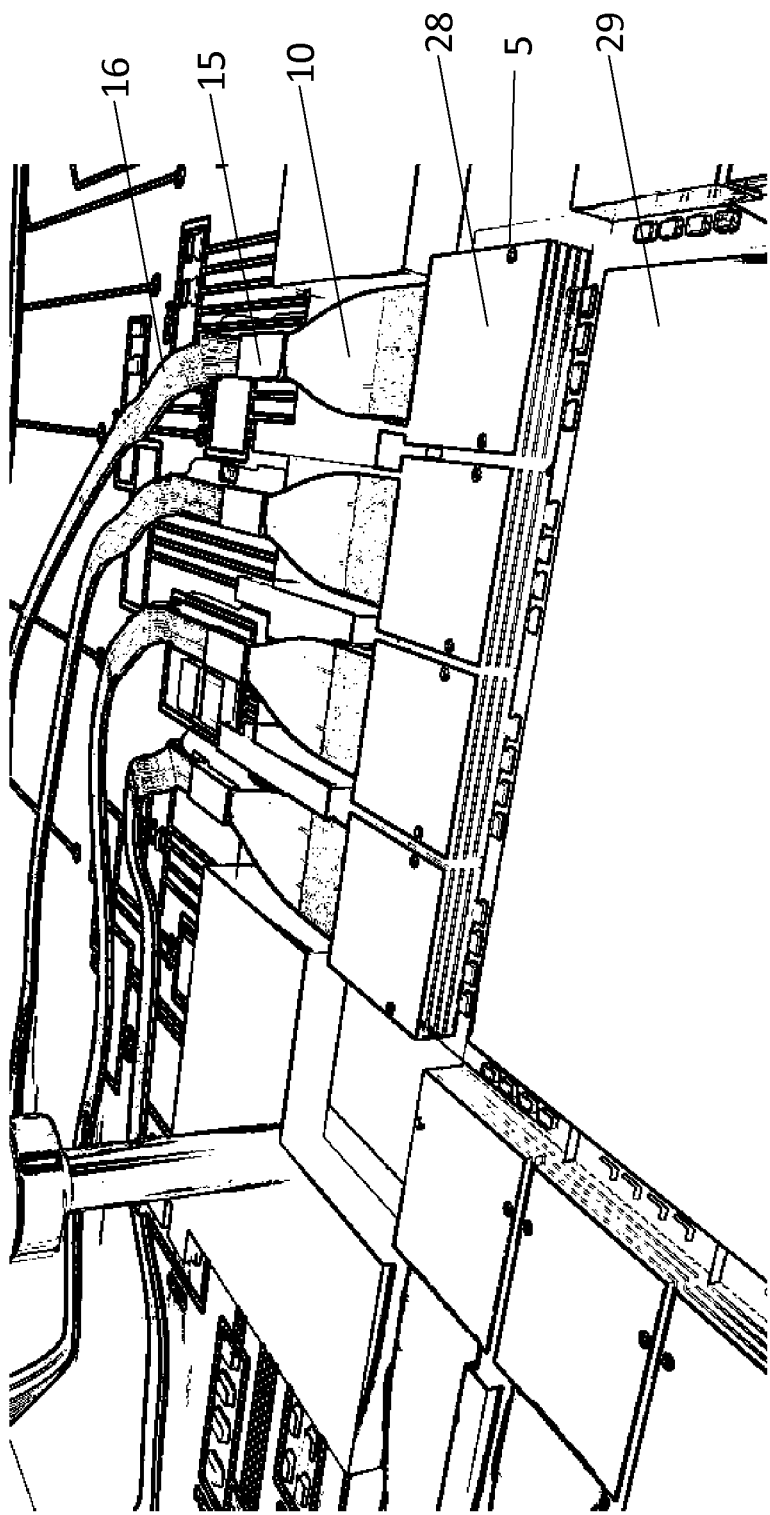
Figure 6:
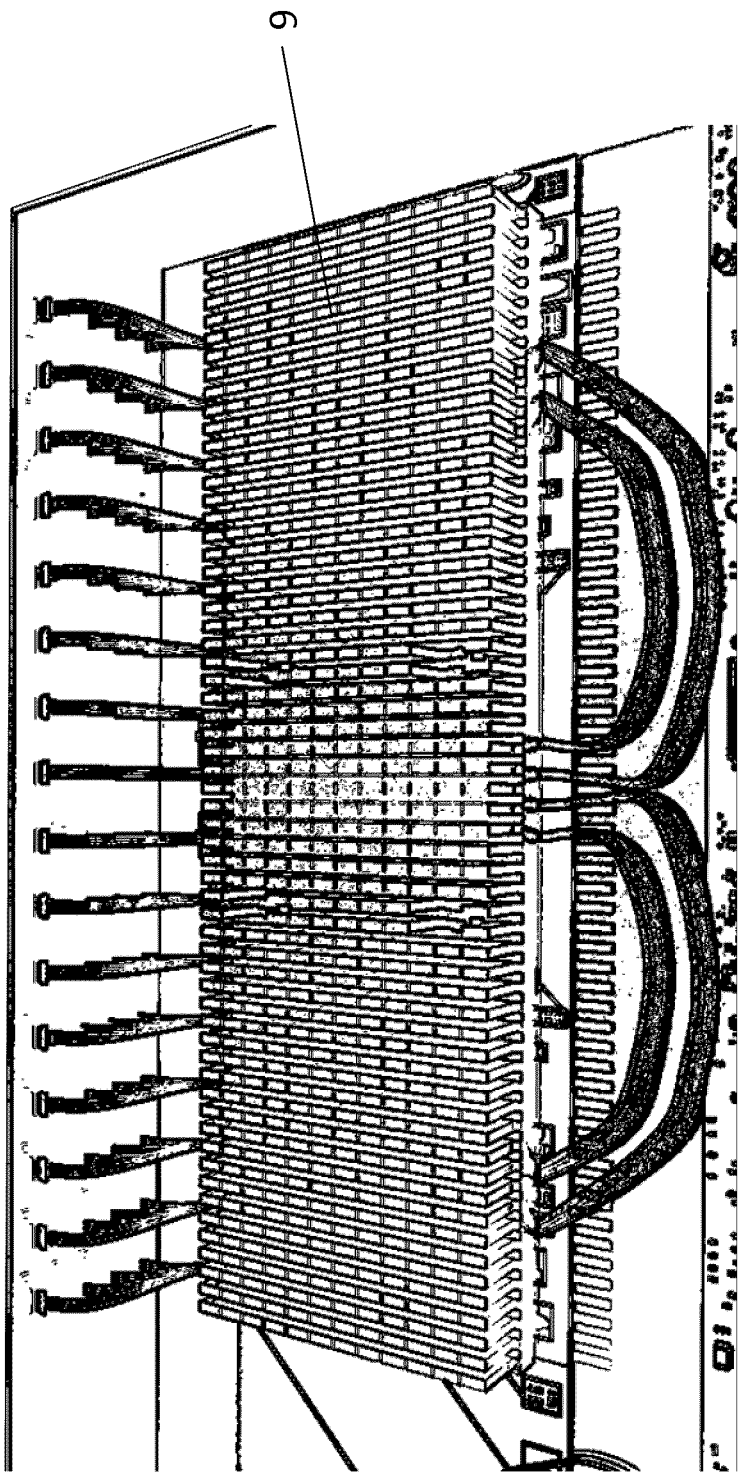
Figure 7:
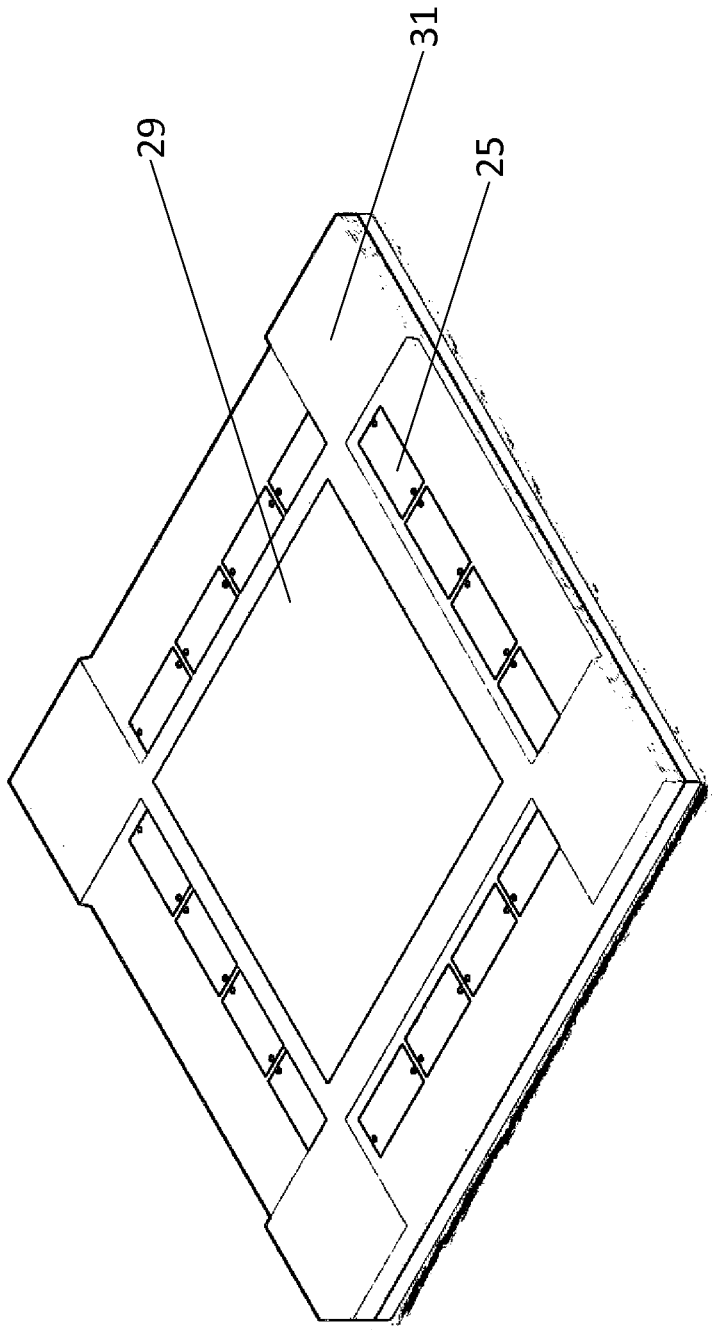
Figure 8:
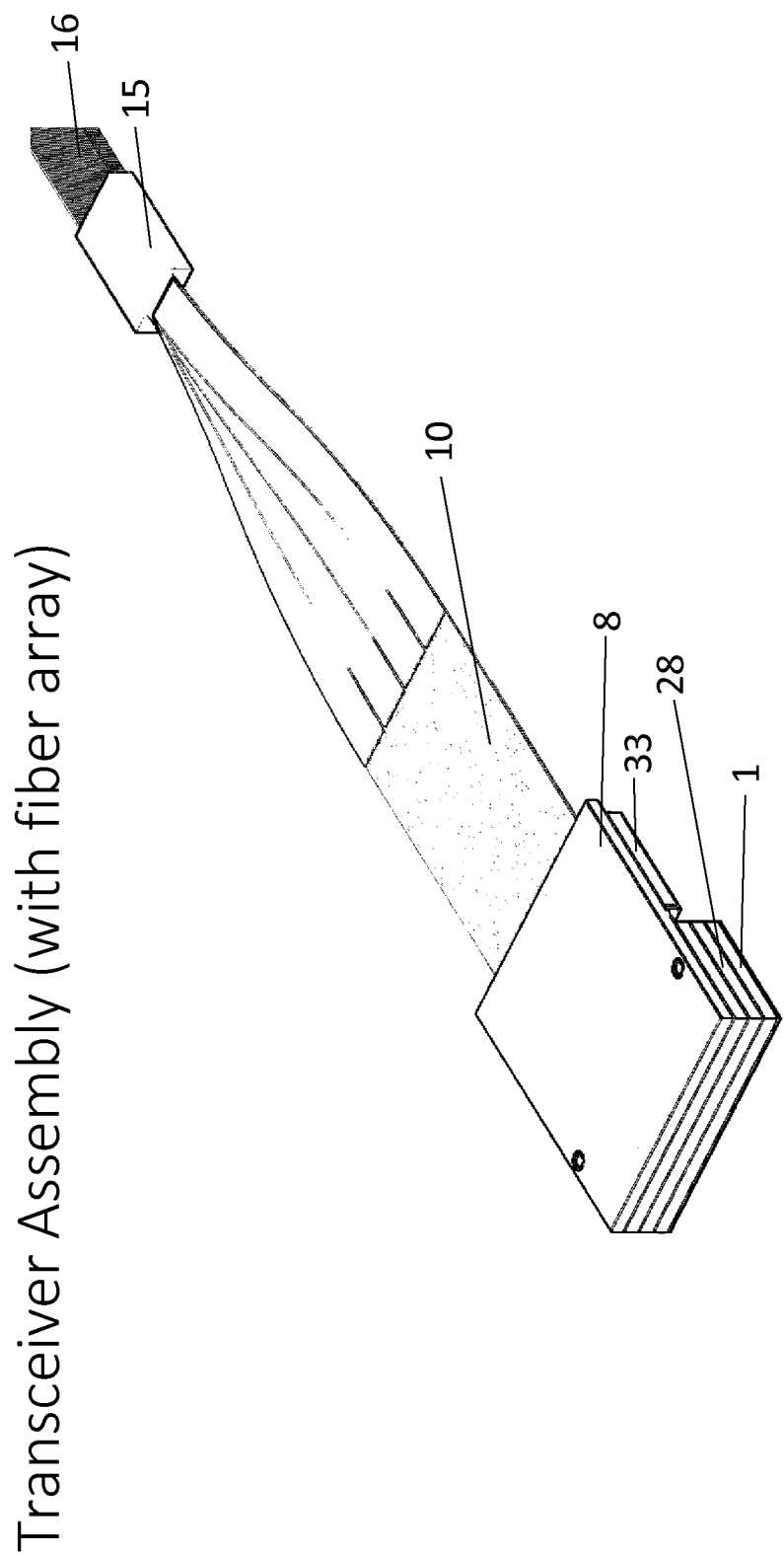
Figure 9:
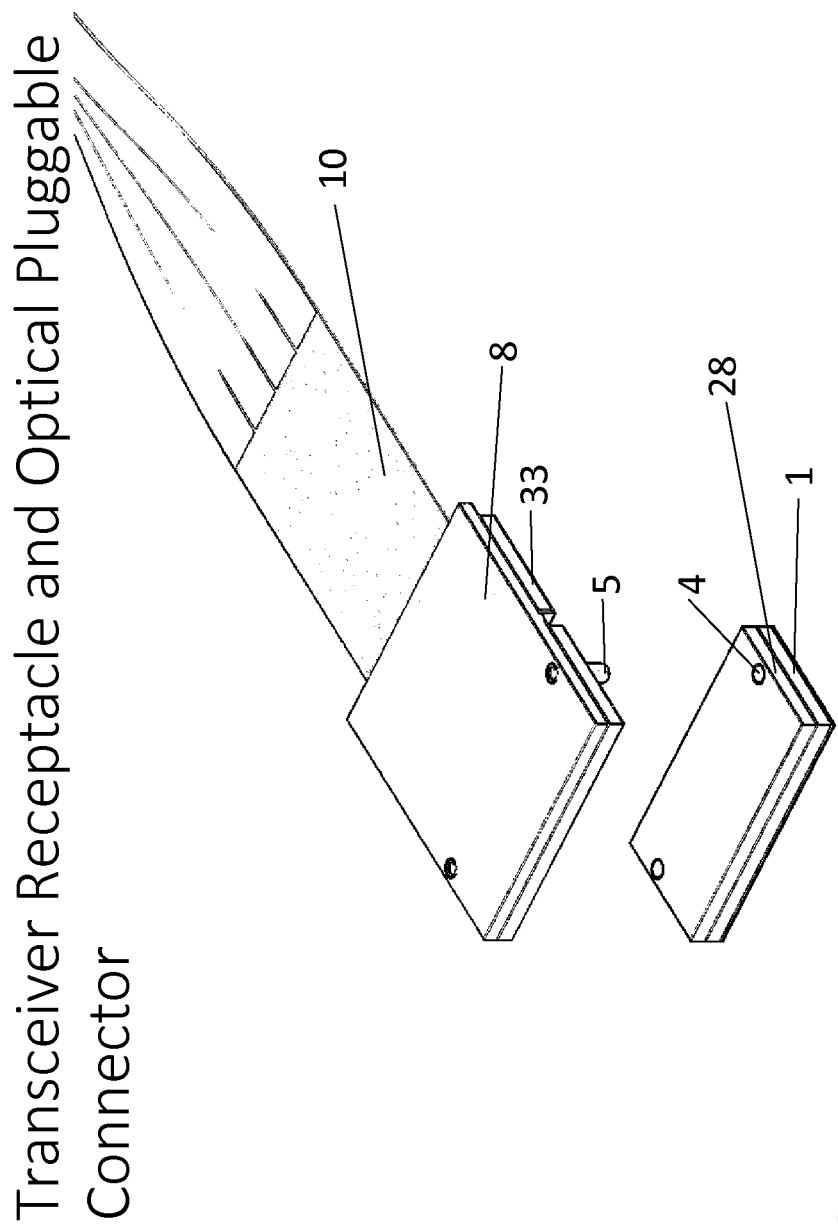
Figure 10:
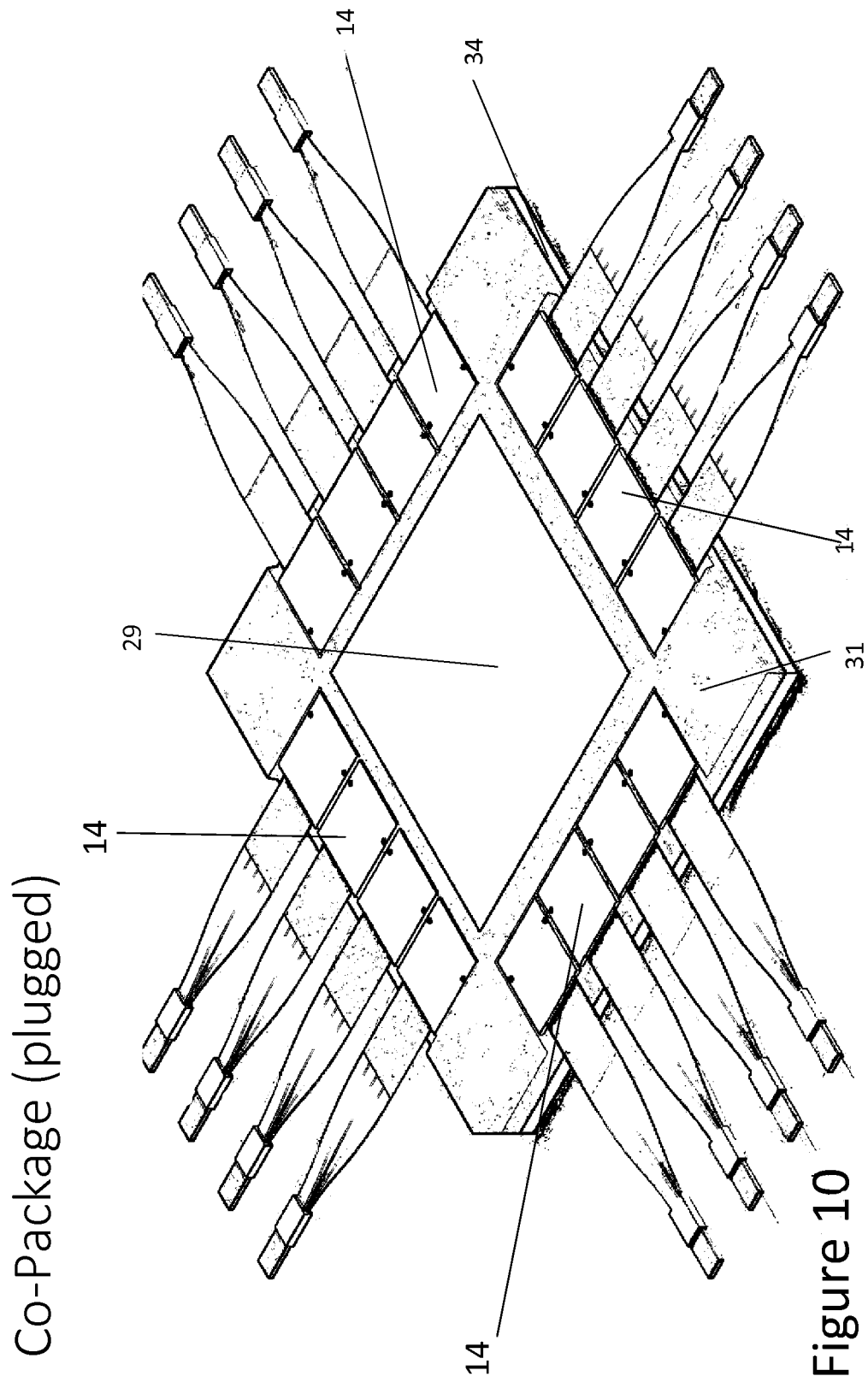
Figure 11:
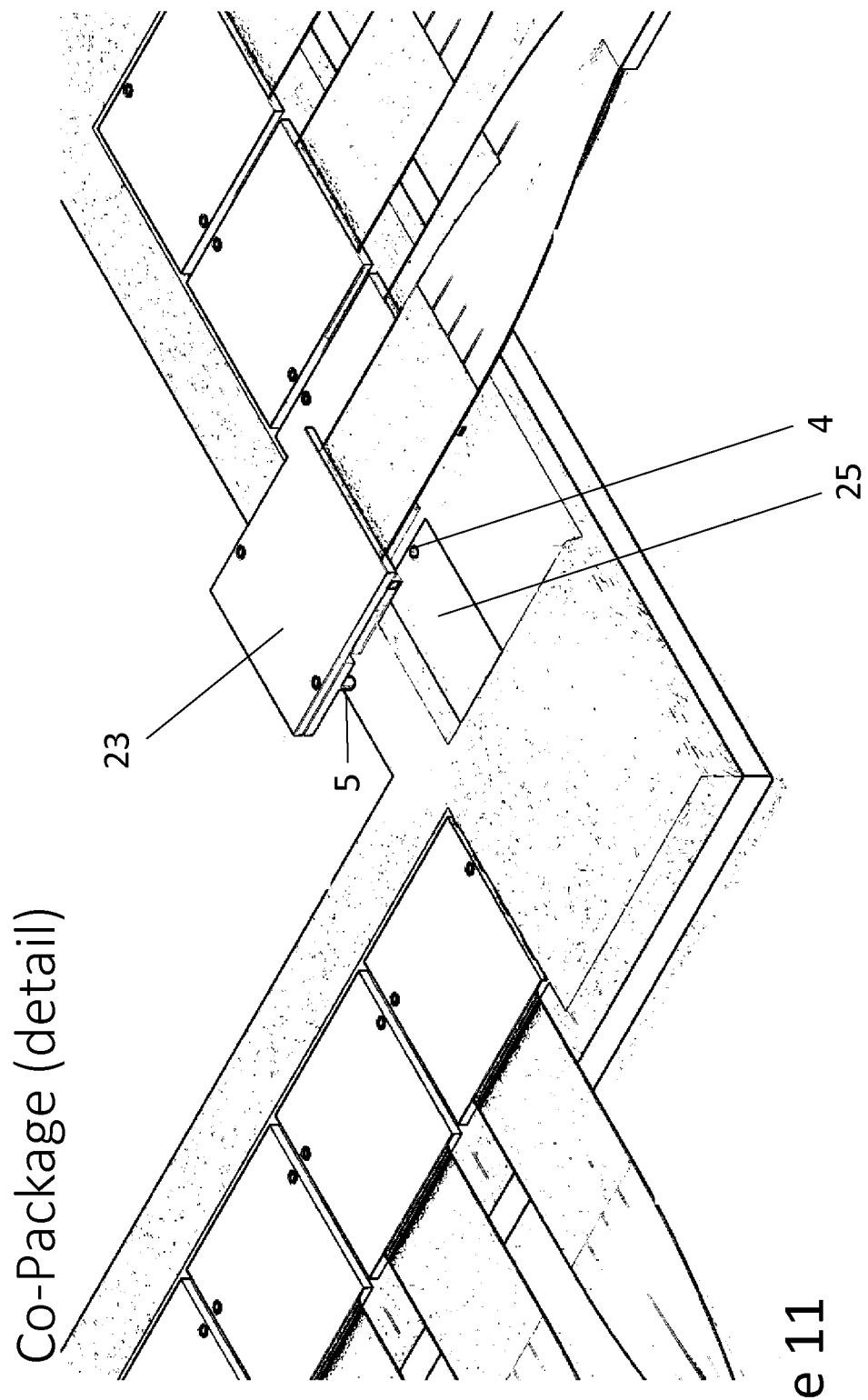

Alternatively, lenses 13 for beam shaping may be located in the enclosure of the transceiver chip 1 as shown in FIGS. 1 and 2. FIGS. 1 and 2 depict another exemplary embodiment of a pluggable optical connector 23 and a receptacle 25.

In the embodiment of FIGS. 1 and 2, the transceiver chip 1 is directly mounted on the high-speed substrate 34 that also carries the switch ASIC 29.

The Switch ASIC 29 is preferably connected to a plurality of optical transceiver assemblies 14, preferably four optical transceiver assemblies 14 as shown in the Figures. Each transceiver assembly 14 preferably comprises one transceiver chip 1, a primary high-speed substrate 2, a set of coarse and fine alignment features on plug 5 and 7, respectively, and receptacle side 4 and 6, respectively, a DSP chip 3 and a fiber mount 8 with fiber ribbon 10 permanently attached to the fiber mount.

In case of n (n>1) optical transceiver assemblies 14, the transceiver assemblies 14 are preferably arranged in a rotational symmetry of order n, also called n-fold rotational symmetry, or discrete rotational symmetry of the nth order, with respect to the Switch ASIC 29. In case of sixteen optical transceiver assemblies 14, the optical transceiver assemblies 14 are preferably arranged in 4-fold rotational symmetry as shown in the Figures (see for instance FIG. 10).

In the drawings and specification above, there are disclosed a plurality of embodiments of the present invention. The applicant would like to emphasize that each feature of each embodiment may be combined with or added to any other of the embodiments in order to modify the respective embodiment and create additional embodiments. These additional embodiments form a part of the present disclosure and, therefore, the applicant may file further patent claims regarding these additional embodiments at a later stage of the prosecution.

Further, the applicant would like to emphasize that each feature of each of the following dependent claims may be combined with any of the present independent claims as well as with any other (one ore more) of the present dependent claims (regardless of the present claim structure). Therefore, the applicant may direct further patent claims towards other claim combinations at a later stage of the prosecution.

The invention claimed is:

1. A switch system comprising:
an optical transceiver assembly connected to a switch ASIC;
wherein a digital signal processing chip of the optical transceiver assembly is located next to a transceiver chip on a primary high-speed substrate,
wherein the primary high-speed substrate is electrically and mechanically connected to a second high-speed substrate;
wherein the switch ASIC is electrically and mechanically connected to the second high-speed substrate;
wherein a distance from the digital signal processing chip to the switch ASIC is smaller than a distance from the transceiver chip to the switch ASIC;
wherein a pluggable optical connector of the optical transceiver assembly comprises a first heat spreader, wherein the first heat spreader is integral to and movable together with the pluggable connector; and
wherein the heat spreader comprises an overlap section, wherein the overlap section overlaps with both the digital signal processing chip and the transceiver chip when the pluggable optical connector is plugged in;
wherein the digital signal processing chip and the transceiver chip are sandwiched between the first heat spreader of the pluggable optical connector and the primary high-speed substrate when the pluggable optical connector is plugged to a transceiver receptacle.

2. The switch system of claim 1,
wherein the switch ASIC is configured to switch electrical signals,
wherein the optical transceiver assembly comprises a layer stack, and
wherein the layer stack includes the following:
the transceiver chip,
a plurality of optical beam forming layers, wherein each of the plurality optical beam forming layers contain lenses or lens arrays etched into the layers' material and which are configured to form an optical beam,
a pluggable optical interface including mechanical guide pins located inside the layer stack, and
an optical imaging system expanding and collimating the optical beam.

3. The switch system of claim 2,
wherein the digital signal processing chip is located between the switch ASIC and the transceiver chip, and
wherein the transceiver chip is located between the digital signal processing chip and a fiber ribbon.

4. The switch system of claim 1, wherein a second heat spreader is located on top of the transceiver assembly.

5. The switch system of claim 4, wherein the first heat spreader is located above both the digital signal processing chip and the transceiver chip when the pluggable optical connector is plugged to the transceiver receptacle.

6. The switch system of claim 4, wherein the first heat spreader is configured to hold the pluggable optical connector in position and to dissipate heat.

7. The switch system of claim 1, wherein the pluggable optical connector encompasses a stack of silicon pieces configured so that heat can be very efficiently dissipated away from the transceiver chip.

8. The switch system of claim 1, wherein the switch ASIC is configured to switch electrical signals.

9. The switch system of claim 1, wherein the primary high-speed substrate is electrically and mechanically connected to the second high-speed substrate via a ball grid array or a land grid array on the bottom of the primary high-speed substrate.

10. The switch system of claim 1, wherein the primary high-speed substrate is rectangularly shaped and has dimensions in the range of 7-10 mm by 20-40 mm.

11. The switch system of claim 1, wherein the optical transceiver assembly comprises eight optical transceiver assemblies, and wherein four optical transceiver assemblies are arranged on each side of the switch ASIC and are located in the same plane as the switch ASIC.

12. The switch system of claim 1, wherein the optical transceiver assembly includes one alignment feature for coarse alignment and a second alignment feature for fine alignment.

13. The switch system of claim 12, wherein the second alignment feature is implemented in a layer stack of one or both of the pluggable optical connector and the transceiver receptacle.

14. The switch system of claim 1, wherein the primary high speed substrate is a circuit board.

15. The switch system of claim 1, wherein the pluggable optical connector comprises silicon.

16. The switch system of claim 1, wherein the first heat spreader of the pluggable optical connector comprises silicon.

17. A switch system comprising:
an optical transceiver assembly;
wherein the optical transceiver assembly is connected to a switch ASIC;
wherein the switch ASIC switches electrical signals;
wherein the optical transceiver assembly includes a layer stack; and
wherein the layer stack comprises:
  a transceiver chip,
  optical beam forming layers, which each layer includes lenses or lens arrays etched into the layers' material and which are configured to form an optical beam,
  a pluggable optical interface including mechanical guide pins, and
  an optical imaging system expanding and collimating the optical beam;
wherein a digital signal processing chip of the optical transceiver assembly is located next to the transceiver chip on a primary high-speed substrate,
wherein the primary high-speed substrate is electrically and mechanically connected to a second high-speed substrate;
wherein the switch ASIC is electrically and mechanically connected to the second high-speed substrate;
wherein a distance from the digital signal processing chip to the switch ASIC is smaller than a distance from the transceiver chip to the switch ASIC;
wherein a pluggable optical connector of the optical transceiver assembly comprises a first heat spreader, wherein the first heat spreader is integral to and movable together with the pluggable connector; and
wherein the heat spreader comprises an overlap section, wherein the overlap section overlaps with both the digital signal processing chip and the transceiver chip when the pluggable optical connector is plugged in;
wherein the digital signal processing chip and the transceiver chip are sandwiched between the first heat spreader of the pluggable optical connector and the primary high-speed substrate when the pluggable optical connector is plugged to a transceiver receptacle.

18. The switch system of claim 17,
wherein the digital signal processing chip is located between the switch ASIC and the transceiver chip, and
wherein the transceiver chip is located between the digital signal processing chip and a fiber ribbon.

19. The switch system of claim 17, wherein a second heat spreader is placed on top of the transceiver assembly.

20. The switch system of claim 19, wherein the first heat spreader is located above both the digital signal processing chip and the transceiver chip when the pluggable optical connector is plugged to the transceiver receptacle.

21. The switch system of claim 19, wherein the first heat spreader is configured to hold the pluggable optical connector into position and to dissipate heat.

22. The switch system of claim 17, wherein the pluggable optical connector encompasses a stack of silicon pieces configured so that heat can be very efficiently dissipated away from the transceiver chip.

23. The switch system of claim 17, wherein the primary high-speed substrate is electrically and mechanically connected to the second high-speed substrate via a ball grid array or a land grid array on the bottom of the primary high-speed substrate.

24. The switch system of claim 17, wherein the optical transceiver assembly comprises eight optical transceiver assemblies, and wherein four optical transceiver assemblies are arranged on each side of the switch ASIC and are located in the same plane as the switch ASIC.

25. The switch system of claim 24, wherein the optical transceiver assembly includes one alignment feature for coarse alignment and a second alignment feature for fine alignment.

26. The switch system of claim 17, wherein the primary high speed substrate is a circuit board.

* * * * *